United States Patent [19]

Etienne et al.

[11] Patent Number: 4,862,088

[45] Date of Patent: Aug. 29, 1989

[54] REMOTE LOCATING OF A STRUCTURE AND REMOTE MEASUREMENT OF CONDITIONS THEREIN

[75] Inventors: Nolf J. Etienne, Kessel-Lo, Belgium; Atkinson E. Browell, Wallbrook Ipswich, England

[73] Assignee: Raychem Corporation, Menlo Park, Calif.

[21] Appl. No.: 784,407

[22] Filed: Oct. 4, 1985

[30] Foreign Application Priority Data

Oct. 11, 1984 [GB] United Kingdom ............... 8425761

[51] Int. Cl.[4] .................. G01V 3/08; G01V 3/10; G01R 9/00; G08B 21/00
[52] U.S. Cl. .................................. 324/326; 324/67; 340/870.16; 174/11 R
[58] Field of Search ............ 324/326, 329, 67; 174/11 R, 88 R; 340/870.16, 870.17, 870.33

[56] References Cited

U.S. PATENT DOCUMENTS

| | | | |
|---|---|---|---|
| 3,163,703 | 12/1964 | McLoad | 174/11 R |
| 3,452,597 | 7/1969 | Grady, Jr. | 340/870.17 |
| 4,025,912 | 5/1977 | Rice | 340/870.17 |
| 4,533,788 | 8/1985 | Pokojny et al. | 174/88 R |
| 4,549,039 | 10/1985 | Charlebois et al. | 324/326 |

FOREIGN PATENT DOCUMENTS

| | | |
|---|---|---|
| 3151523 | 7/1983 | Fed. Rep. of Germany ...... 324/326 |
| 2312272 | 9/1983 | Fed. Rep. of Germany . |
| 2469783 | 5/1981 | France ............................ 174/11 R |
| 1311585 | 3/1973 | United Kingdom . |
| 1371006 | 10/1974 | United Kingdom . |
| 1471954 | 4/1977 | United Kingdom . |
| 1543156 | 3/1979 | United Kingdom . |
| 2043911 | 1/1980 | United Kingdom . |
| 2057696 | 1/1984 | United Kingdom . |

Primary Examiner—Reinhard J. Eisenzopf
Assistant Examiner—Walter E. Snow
Attorney, Agent, or Firm—A. Stephen Zavell; Herbert G. Burkard

[57] ABSTRACT

Remote sensing of conditions in telecommunications splice case, such as pressure or humidity. The splice case may contain a transducer which alters a resonant frequency of a circuit associated with the splice case.

29 Claims, 14 Drawing Sheets

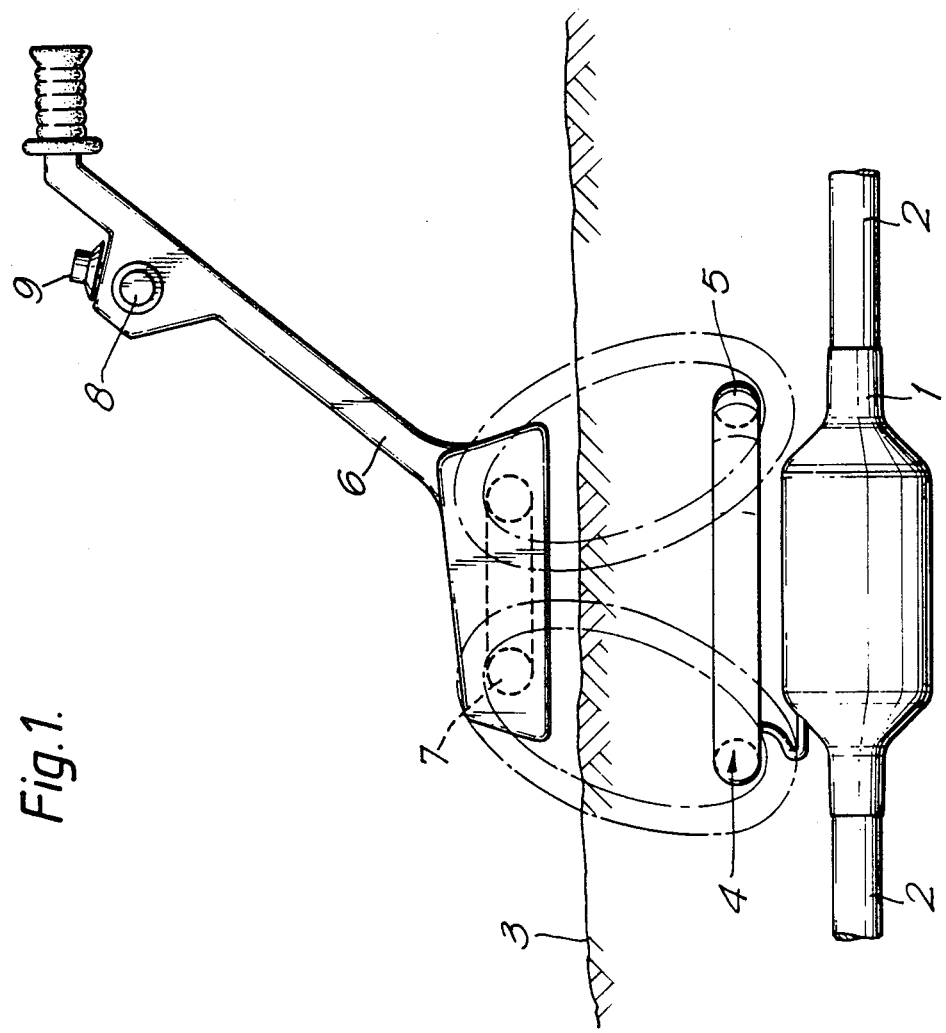

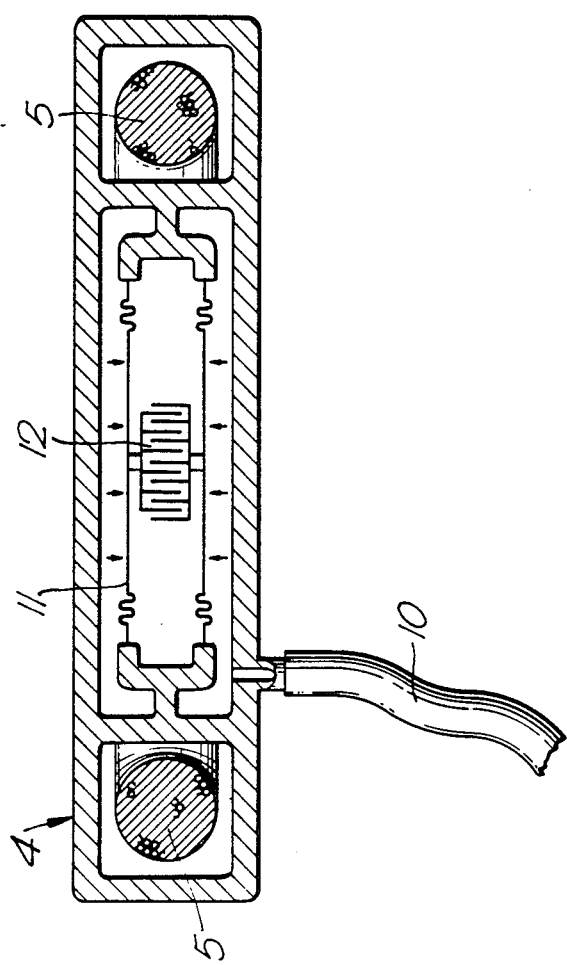

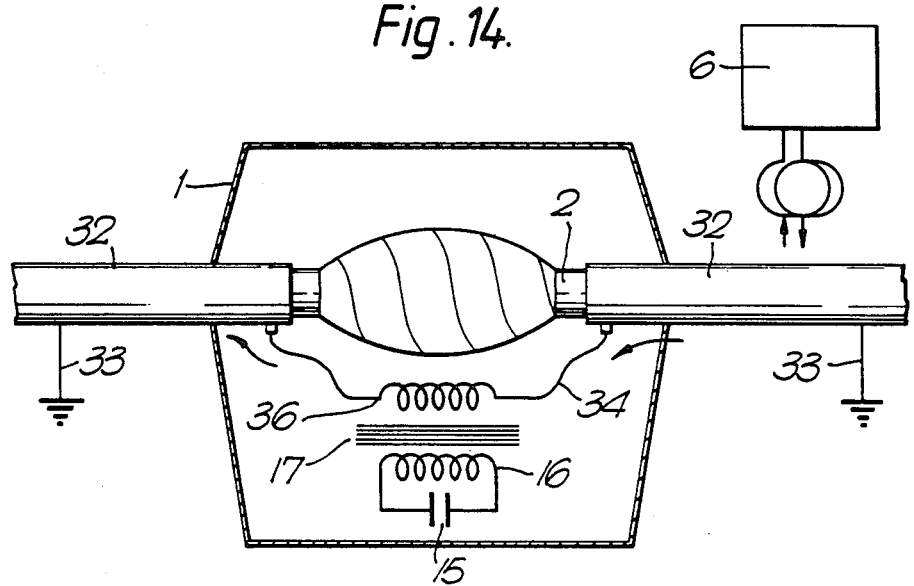
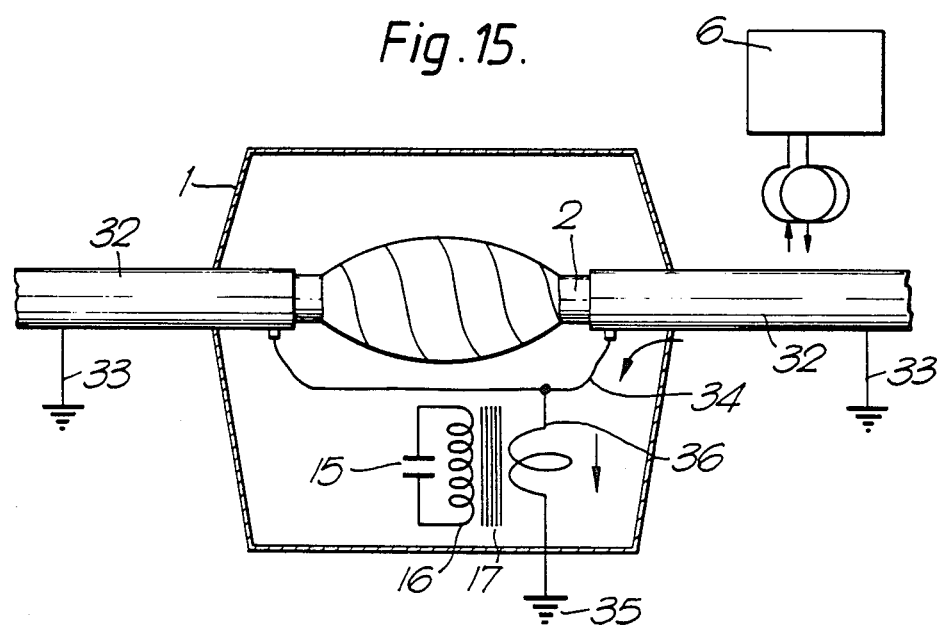

REMOTE LOCATING OF A STRUCTURE AND REMOTE MEASUREMENT OF CONDITIONS THEREIN

The present invention relates to the remote measurement of conditions in cables, pipes or other supply lines, particularly those that are buried, or other conduits or cavities that are not easily accessible.

Certain conditions must be maintained in supply lines if they are to function reliably. For example, a telecommunications cable must remain dry in order that its electrical or optical performance be constant. If it is to remain dry, any splice case or other seals must not fail and this requires the cable to be kept within certain temperature limits. Main telecommunications cables are pressurized in order to resist moisture ingress, to flush out any moisture with fresh dry air or to provide an indication of any leaks by means of a noticeable localized pressure drop. These three conditions, humidity, temperature, and pressure, together with others, are usefully monitored as a means of prevention of electrical failure since any change in these conditions will precede electrical failure, and repair can quickly be made.

There is a further consideration that is relevant to the maintenance of correct conditions within a cable. It is clearly necessary that one be able to locate the cable in order to carry out monitoring or repair, and in particular it is necessary to locate the splice cases which join together lengths of cable, since it is at such joints that faults are most likely to occur. We are particularly interested in fibre optic network systems with no metal content where location is difficult or impossible.

Where a cable is buried, many unnecessary excavations may be made before the cable is located or before the faulty splice case is discovered. Some techniques for location have been proposed which can avoid this, and three will be described.

UK Patent Specification 1471954 describes a method for detecting or locating faults or identifying conductors in a multi-conductor cable. A tone generator having a certain frequency tone is connected to one or more conductors of the cable at a first location. A tunable frequency amplifier is then temporarily connected to the tone generator, and tuned to the frequency emitted by the generator. The amplifier is then decoupled, and the presense or absence of the applied tone at a second location is sensed by applying a signal from a pick-up means to the amplifier: the amplified output available from the amplifier is monitored for the presence or absence of the tone signal at the second location. The pick-up means may be a coil capable of sensing the magnetic field associated with the tone current, which magnetic field will disappear when the coil is moved along the cable to the position of the faulty conductor. Disadvantages of this system are that it requires connection to the conductors of the cable and that it is only for location of conductors of faults therein. Measurement of a condition within the cable still requires excavation.

A second technique is provided by Automation Products Company of Austin, Texas, USA whose product EMS (Electronic Marker System) consists of a marker, which may be buried above a cable or cable splice case, and a detector which may be passed over the ground above the marker and which emits a tone whose amplitude varies with distance from the marker. The marker is about 37.5 cm or about 15 cm in diameter and consists of an encased tuned, passive circuit. This product provides only location, and it relies on the marker being properly buried with the object later to be detected since, in the case of cables at least, it is far too large to be incorporated therein. Again, excavation is required for measurement of any internal conditions.

Buried cable splice cases have also been located, and conditions therein have been measured, by providing a pressure access valve in the case and a conduit which passes from the valve to ground level. This solution is expensive and cumbersome, and in any case not suitable for some buried locations.

We have now perceived the need for sensing a condition within a cable or cable splice etc. which is truely remote, and which therefore does not need connection by means of for example a dedicated pair within the cable solely for sensing.

Thus, the present invention provides an article comprising: an enclosure adapted to form part of or to cooperate with a supply line; and a sensor capable of responding to a condition within the enclosure or the supply line, the sensor response being capable of being detected remotely such that a condition of the enclosure on the supply line can be determined without requiring access to the enclosure or the supply line.

Preferably, the sensor comprises an electrical circuit capable of responding to electromagnetic radiation, and means capable of causing an output signal of the circuit to be modified, for example modulated, in response to a change in said condition. More preferably, the circuit is a tuned circuit whose resonant frequency, amplitude or duration of output is a function of said condition. The circuit may be passive or active.

The sensor may be provided inside the supply line or device, although it may be located outside and in communication with it. Alternatively, a part of the sensor which transmits may be located outside the supply line or device, and a part which modulates the transmitted signal according to the condition to be measured may be located inside.

Before preferred sensors themselves are discussed, mention will be made of preferred instances of use.

The supply line with which the sensor is used is preferably a pipe for example a pre-insulated pipe where leaks would damage the insulation, or a cable for example a power or telecommunications cable, particularly an optical fibre cable where a lack of metal makes traditional location techniques inoperative. We envisage that the sensor will be particularly useful in conjunction with devices for enclosing joints in supply lines since it is at such enclosures that faults are most likely to occur. Preferred devices are cable splice cases, especially optical fibre splice cases, which in general, comprise a housing and means for sealing the housing to the supply line. The housing preferably comprises a wraparound or tubular sleeve and the means for sealing may comprise one or more of mechanical clamps, dimensional-recoverability of the sleeve or of an additional component, or a sealing material such as a sealant for example a mastic, or an adhesive for example a hot-melt adhesive. The article of the invention thus preferably comprises a sleeve which can enclose both a joint in a cable and the sensor, and which can be sealed at least in part by dimensional recoverability.

In general, a dimensionally-recoverable article is an article the dimensional configuration of which may be made substantially to change when subjected to some treatment, and a heat-recoverable article is one whose configuration changes on heating.

Usually these articles recover towards an original shape from which they have previously been deformed but the term recoverable, as used herein, also includes an article that adopts a new configuration, even if it has not been previously deformed.

In their most common form, such articles comprise a heat-shrinkable sleeve made from a polymeric material exhibiting the property of elastic or plastic memory as described, for example, in U.S. Pat. Nos. 2,027,962; 3,086,242 and 3,597,372. As is made clear in, for example, U.S. Pat. No. 2,027,962, the original dimensionally heat-stable form may be a transient form in a continuous process in which, for example, an extruded tube is expanded, whilst hot, to a dimensionally heat-unstable form but, in other applications, a preformed dimensionally heat stable article is deformed to a dimensionally heat-unstable form in a separate stage.

In the production of heat-recoverable articles, the polymeric material may be cross-linked at any stage in the production of the article that will enhance the desired dimensional recoverability. One manner of producing a heat-recoverable article comprises shaping the polymeric material into the desired heat-stable form, subsequently cross-linking the polymeric material, heating the article to a temperature above the crystalline melting point or, for amorphous materials the softening point, as the case may be, of the polymer, deforming the article and cooling the article whilst in the deformed state so that the deformed state of the article is retained. In use, since the deformed state of the article is heat-unstable, application of heat will cause the article to assume its original heat-stable shape.

In other articles, as described, for example, in British Pat. No. 1,440,524, an elastomeric member such as an outer tubular member is held in a stretched state by a second member, such as an inner tubular member, which, upon heating, weakens and thus allows the elastomeric member to recover.

Heating may be brought about by use of a hot-air gun or by a torch, but we prefer it to be brought about electrically. A discrete electrical heater may be used in thermal contact with the recoverable article, or the recoverable article may itself be electrically heatable. For example, the recoverable article may comprise a conductive polymer composition together with suitably placed electrodes by means of which an electrical current may be made to pass through it. An electrically recoverable article is preferably self-regulating with respect to temperature since this makes installation less craft-sensitive. In, particular, we prefer that the recoverable article be self-heating and comprise a conductive polymer composition that has a positive temperature coefficient of resistance.

Such electrical recoverability is preferably used in the present invention in the following way. A splice case is formed from a housing which encloses the spliced conductors or optical fibres together with the sensor. The housing has outlets, which may be integral or discrete, through which the ingoing cables pass and within which they are sealed. These outlets preferably comprise electrically heat-shrinkable sleeves formed from a shrinkable conductive polymer composition, and optionally a constant wattage polymer composition, positioned between collapsible electrodes.

A cable splice case may comprise components in addition to the housing mentioned above. For example a liner may be provided to give mechanical strength, and heat or moisture vapour barriers may also be provided. A moisture vapour barrier generally comprises a metal foil, the prior art designs of which would prevent reception of an electromagnetic signal from an internal sensor due to their acting as a screen. We have discovered that one solution to this problem is to provide a series of slots (which are illustrated in the drawings) or holes in the moisture vapour barrier in such a way that they remain after any dimensional recovery of the housing during installation. Such slots are of course different in design and function from slots provided in some prior art liners for the purpose of providing tapered ends to a splice case. These prior art liners may be regarded as cylindrical with crowned ends which collapse to provide the desired tapered ends.

The design of the sensor will now be considered. The sensor must allow information to be received remotely, that is without wires. We prefer that transmission be by means of electromagnetic radiation, but it may be made by other means such as sonically.

Whatever the means of transmission, the sensor may be passive, by which we means that it consumes no power, or it may be active either continually consuming power or consuming power only when switched on. If it is to consume power we prefer that it can be switched on remotely and that it switches itself off after a period sufficiently long for the desired readings to be taken. It is of course possible for switching off to be required as a positive step, but this has the risk that the sensor may be left on thus draining the power supply. The advantage of a passive sensor is that no power supply is required, hence it can have a long lifetime, and the disadvantage is a weaker and less accurate transmission of information.

Information regarding the condition of a supply line or device for enclosing a joint therein may be conveyed in a variety of ways. In general, the signal may be amplitude modulated or frequency modulated or its duration may be varied as a function of the condition, or a combination of these may be used. Information regarding different conditions may be differentiated by the same type of receiver by, for example, any one or more of the following techniques. Firstly, different conditions may require a receiver to be positioned at different locations (a trivial example being the receipt of information from different splice cases along a cable). Secondly, information regarding different conditions may be transmitted electromagnetically with different polarizations. Thirdly, the frequency, amplitude and duration of a signal could give information regarding three different conditions. Fourthly, each condition could be assigned a different narrow range of frequency, amplitude or duration of signal, each narrow range being separated from any other. Fifthly, the signal could modulated in one way and identified by type in another way, for example by amplitude modulation of signals on different carrier frequencies. A sixth technique would be to design the sensor or sensors to transmit information on the different conditions in a predetermined order.

The different conditions referred to above may be conditions of different type, for example pressure, temperature, relative humidity or mere presence of water, or they may be the same type of condition but at different locations, or they may be both. Conditions of different type could of course be differentiated by the receiver by arranging for the signal to be transmitted from different locations or in different directions. An example of the need to transmit information regarding different but close locations (where simple separation of the transmitted signals is insufficient) includes pressures or humidity levels at either side of cable blocks or across moisture barriers in pre-insulated pipe joints etc. A second example is where conditions in two or more adjacent cables and/or pipes are to be measured.

Whether any apparatus is needed to receive the information from the sensor, and if so what type, will of course depend on the nature of the sensor. It is in principle possible for the sensor to transmit audible or visual information that needs no apparatus for interpretation; but where the splice case or other article to be investigated is buried or where the sensor requires switching on, some kind of apparatus will be desirable.

In general terms, the apparatus may simply be capable of receiving information from the sensor. This will allow location of the sensor (and hence the splice case or other article in or by which it is positioned) since the strength of the signal received will depend on the relative positions of the apparatus and sensor. In addition, the apparatus will interpret the signal received to give information on the condition to which the sensor is responsive, for example pressure in a splice case. The apparatus may measure the signal received and be provided with a read-out directly in Barr, percentage relative humidity or C or whatever. Alternatively, the person operating the apparatus may be required to alter some parameter of the apparatus to match that of the sensor, in which case a control on the apparatus may be calibrated in the desired quantity. An example is a sensor consisting of a circuit having a characteristic frequency that is a function of, say, pressure. Here the operator would cause his apparatus to scan over a range of transmitted frequencies, and note for example the position of maximum absorption.

In the above paragraph, the apparatus is considered as simply receiving a signal from the sensor. The situation will generally, however, be different from that in order to avoid a continuous consumption of power by the sensor. The ways of overcoming such a continuous power requirement have already been mentioned. They were firstly the use of a passive electrical circuit as the sensor, and secondly use of a remotely controllable switch to activate the sensor.

In each of these cases, the apparatus for interpreting the signal from the sensor will transmit as well as receive. In the first case it will transmit in order to provide energy for absorption by the sensor. In the second case it will transmit to activate the sensor. The transmitted and received signals may be separated from one another simply by direction, by frequency, by amplitude or by time. The last of these is particularly preferred, and here the signal may be transmitted in pulsed form with the detection of ringing being made in the quiet intervals.

Some further general features may be given of a preferred active sensor that requires switching on, and that conveys its information as electromagnetic radiation. The sensor comprises an electrical (which term herein includes electronic) oscillator which is normally quiescent, but which may be activated by an electromagnetic pulse, preferably of radio frequency. It oscillates for a short while and then turns itself off. The frequency, amplitude or duration of oscillation may be a function of the condition to be investigated. The RF signal is preferably modulated by an audio frequency oscillator whose resonant frequency is determined by that condition. The oscillation of the sensor is measured by the apparatus optionally through an antenna which may be a component of the splice case or cable (for example one or more of its conductors or its screen) or may be an additional component positioned outside the splice case or cable. A transducer will be provided as part of the sensor to provide the desired signal variation.

The invention is further illustrated with reference to the following drawings, in which:

FIG. 1 shows the detection of an underground splice case;

FIG. 2 shows a sensor including a pressure transducer;

Figure 3A:
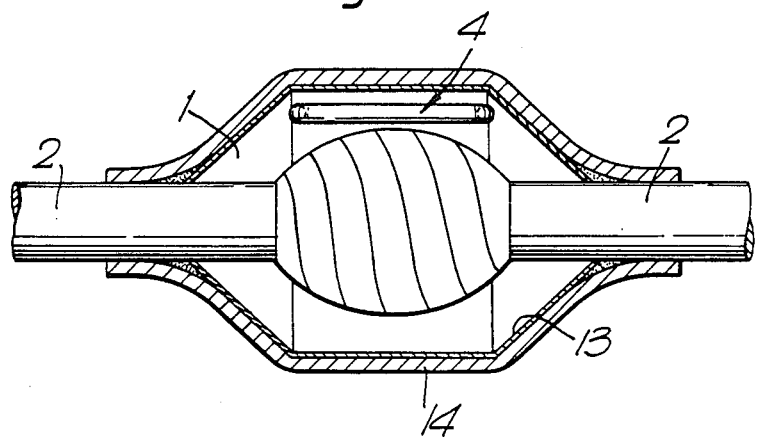
Figure 3B:
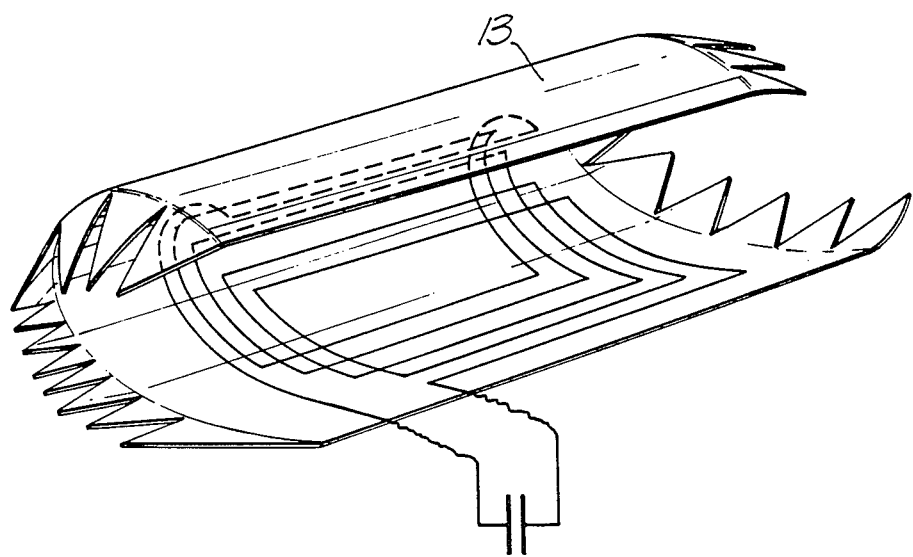
Figure 4:
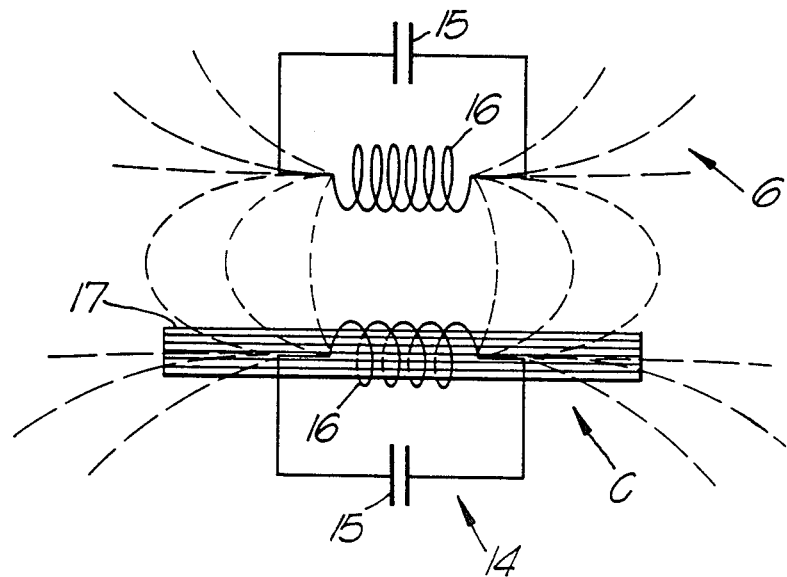
Figure 5:
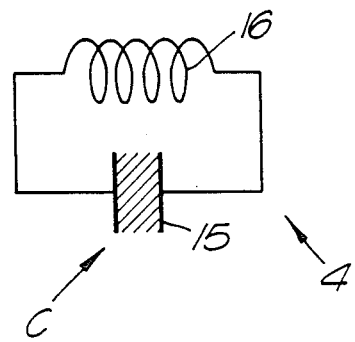
Figure 6:
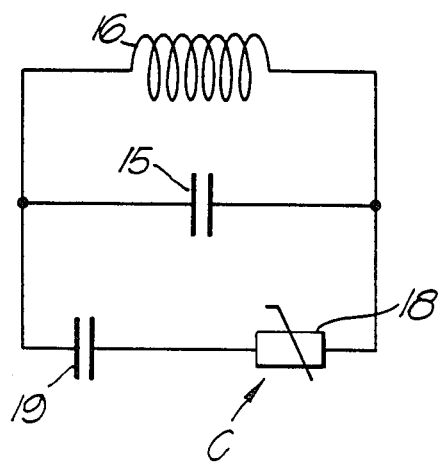
Figure 7:
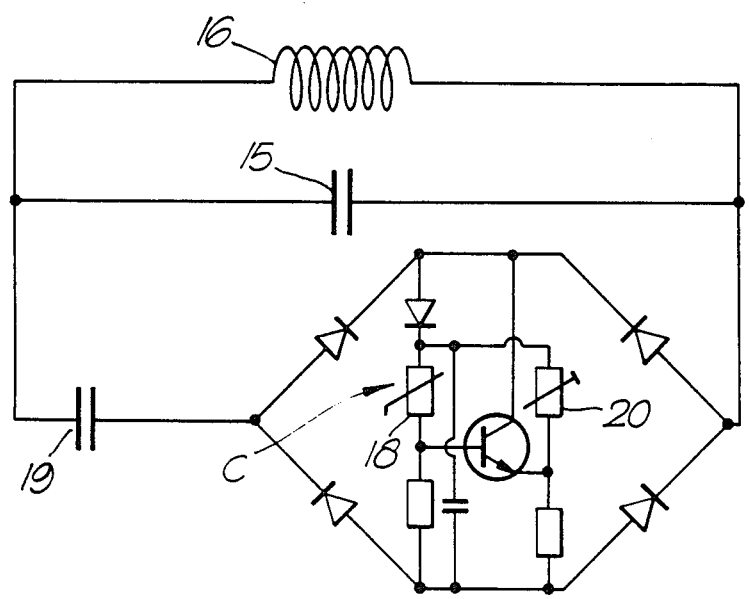
Figure 8:
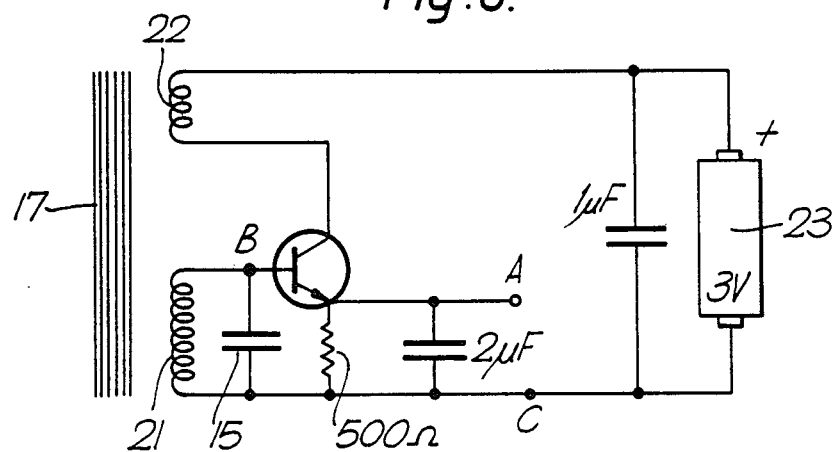
Figure 9:
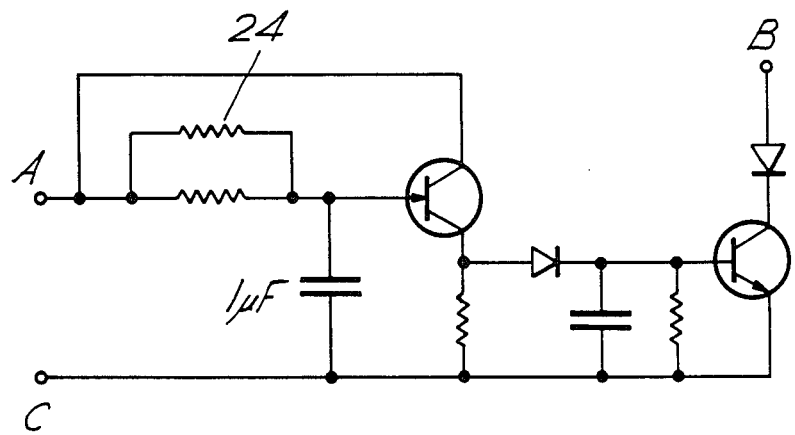
Figure 10:
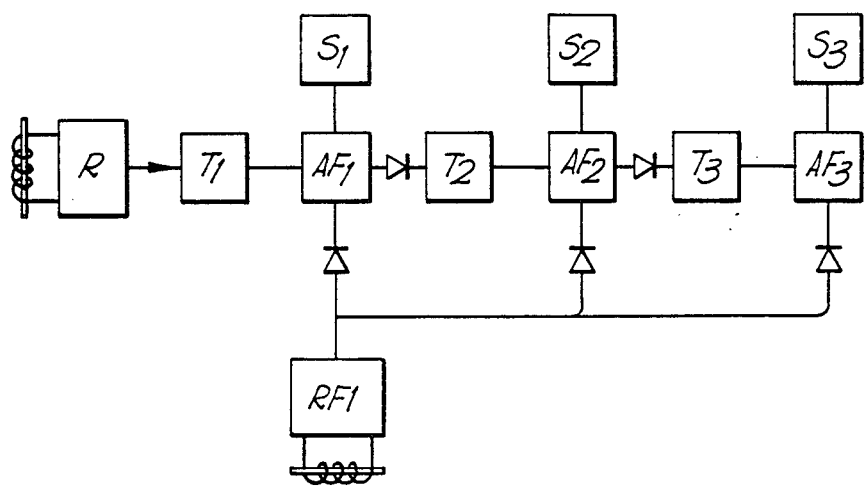
Figure 12:
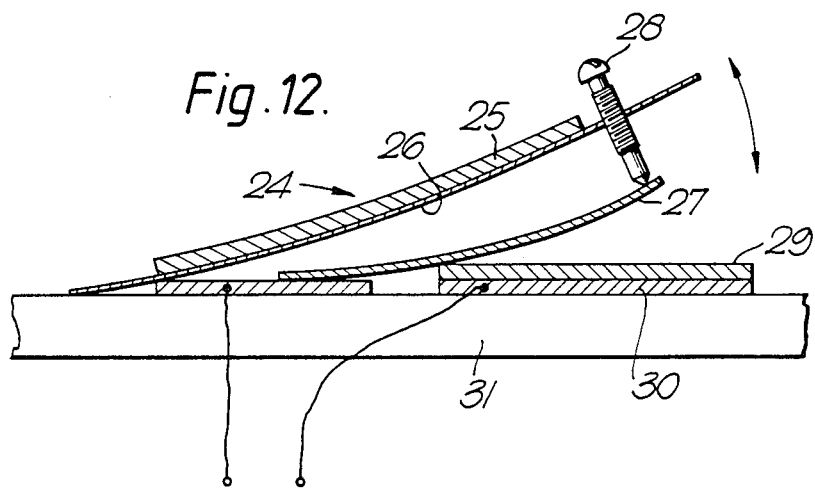
Figure 13:
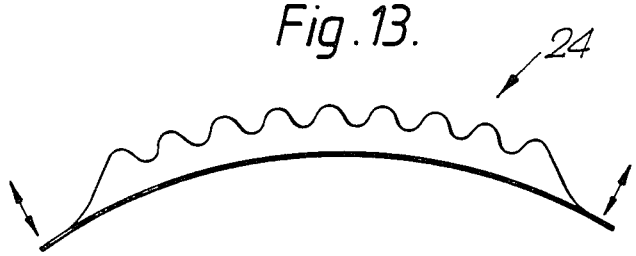
Figure 11:
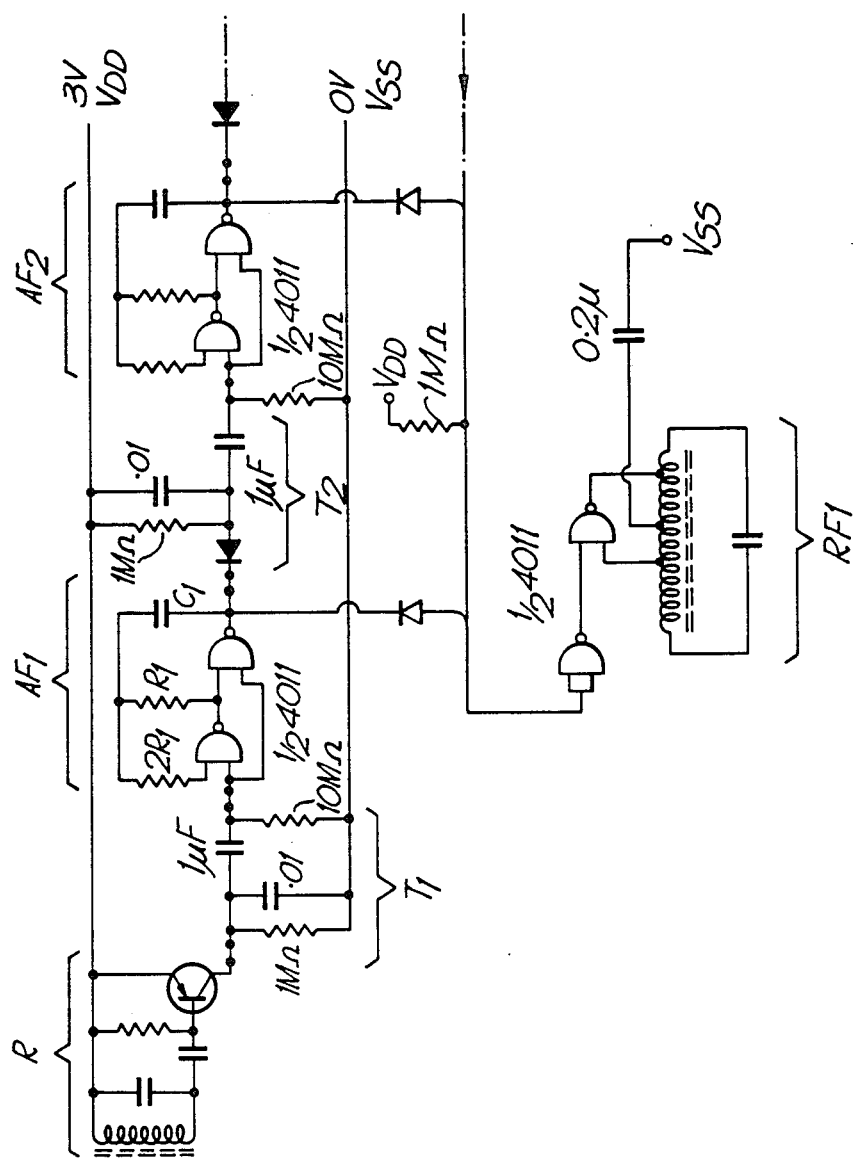
Figure 16:
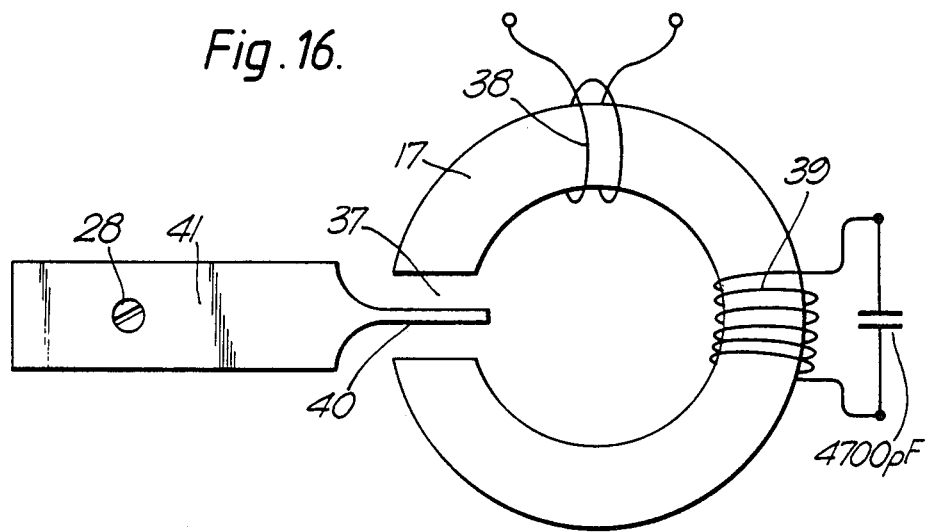
Figure 17:
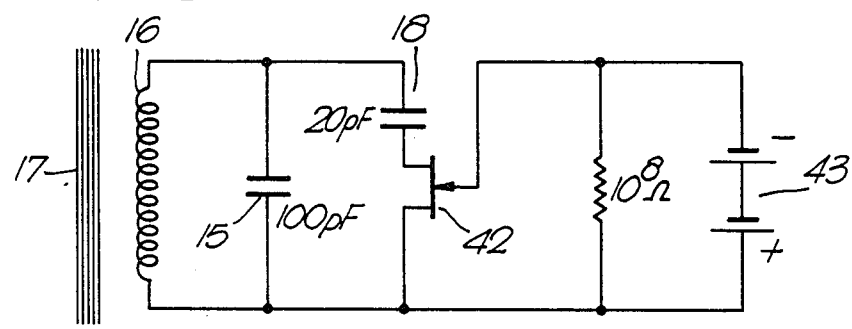
Figure 18:
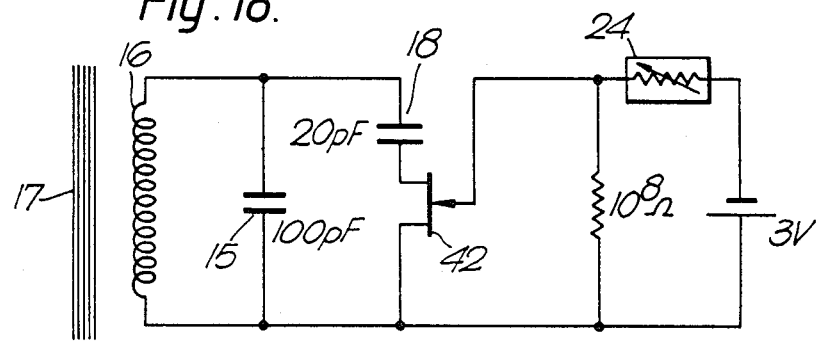
Figure 19A:
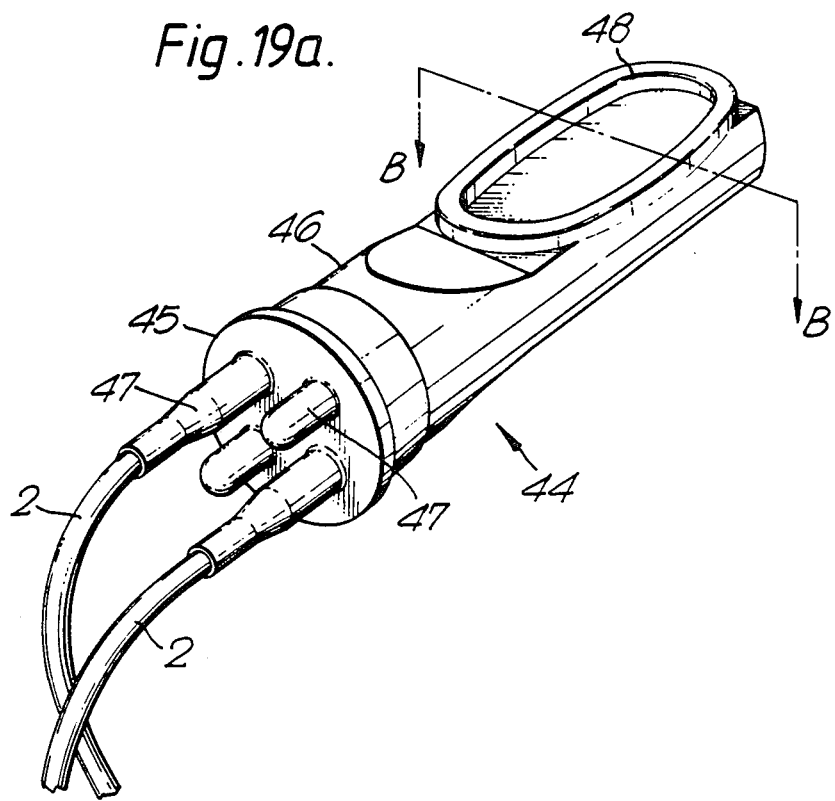
Figure 19B:
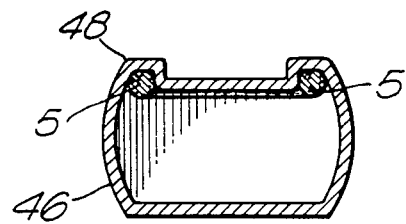

FIGS. 3(a) and 3(b) show a splice case incorporating a sensor;

FIG. 4 shows interaction of passive tuned circuits, one having variable inductance;

FIGS. 5-7 show passive tuned circuits having variable capacitance;

FIG. 8 shows an activatable oscillator circuit;

FIG. 9 shows a timing circuit for use with an oscillator circuit;

FIG. 10 shows schematically a modular system for monitoring a series of conditions;

FIG. 11 shows circuits suitable as the modules of FIG. 10;

FIG. 12 shows a humidity sensitive capacitor;

FIG. 13 shows a pressure transducer;

FIGS. 14 and 15 show techniques for coupling a tuned circuit to a cable screen;

FIG. 16 shows a way in which the inductance of such a coupled tuned circuit may be made to vary;

FIGS. 17 and 18 show passive tuned circuits of variable capacitance;

FIGS. 19(a) and 19(b) show a splice case having a sensor therein; and

Figure 20A:
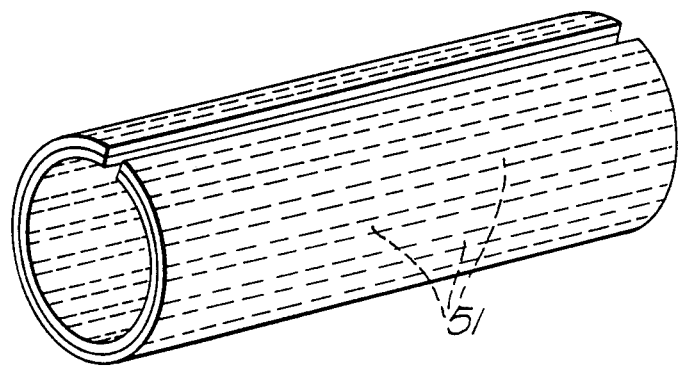

FIGS. 20(a) and (b)-22(a) and (b) show splice cases or liners incorporating metal layers.

FIG. 1 shows a system for receiving information regarding a condition C in a splice case 1 between two cables 2 buried beneath ground level 3. Although the drawings will be discussed in relation to measurement of conditions in cable splice cases, what is said applies also to other supply lines and devices for enclosing joints therein.

The splice case 1 is provided with a sensor 4 comprising, for example, an inductor 5, the sensor being in communication with the splice case via means which can convey information from the splice case to the sensor. This drawings is merely schematic, and the sensor could be housed physically within the splice case. In general, a transducer will be provided to convert information regarding the condition to be measured into a form which is intelligible to the portable receiving apparatus 6. We prefer that the information is transmitted as electromagnetic radiation (particularly of a frequency at which soil or concrete is sufficiently transparent) and that the sensor comprises a resonant circuit. The transducer will in this case alter a characteristic frequency of the circuit by altering its inductance or capacitance in response to the condition C within the splice case.

Where the sensor is located outside the splice case the communication may act to equalize the condition to be measured between the splice case and the sensor, in particular a passage may be provided for equalizing pressure or relative humidity. Alternatively, however, the communication may be merely electrical, a transducer being provided in the splice case which sends an electrical signal to the sensor to alter its characteristic frequency.

The receiving apparatus 6 of FIG. 1 includes an inductor 7 which can electromagnetically couple with the inductor 5 of the sensor. The resonant frequency of the inductor 7 can be altered by means of a control 8 until maximum absorption of the signal from the sensor is noted. The frequency of inductor 7 will then correspond to the value of condition C in the splice case. The control 8 may be callibrated directly in the units of condition 6 or a separate meter 9 may be provided.

The apparatus 6 may transmit as well as receive, and transmission will be necessary if the sensor is passive. In this case the frequency of transmission of inductor 7 may be varied by control 8 to correspond to and absorption peak, or other characteristic frequency, of sensor 4.

Apparatus 6 may provide audible as well as or instead of visual indication of coupling between the two inductors.

FIG. 2 illustrates in cross-section a sensor 4 incorporating a capacitive pressure transducer which is suitable as the sensor of FIG. 1. The sensor 4 is in communication with a splice case by means of conduit 10. The result is that the pressure within the sensor that acts on the outside of flexible membrane 11 is the same, or bears a known relation to, pressure within the splice case. The pressure within the membrane 11 is preferably substantially constant and more preferably a vacuum (in order to avoid the effect of temperature), such that the relative positioning of the plates of variable capacitor 12 is a repeatable function of splice case pressure. Capacitor 12 together with inductor 5 comprises a resonant circuit, whose characteristic frequency is a function of pressure transmitted via conduit 10. The shape of the sensor 4 is not critical, but the membrane preferably forms a generally cylindrical capsule, and the inductor coil preferably forms a generally rectangular loop in a plane perpendicular to the paper as drawn.

FIG. 3 illustrates a splice case 1 between cables 2, formed from a liner 13 and a sleeve 14 recovered into engagement with the liner and cables. A sealing material such as a hot-melt adhesive, shown dotted, has been used to enhance the environmental seal provided by the sleeve 3. In FIG. 3, the sensor 4 is incorporated in the splice case 1. The liner may be provided with a metal layer as a moisture vapour barrier, in which case an antenna may be provided externally of the metal layer (optionally externally of the splice case) or the metal layer may be slit particularly in the case of ferrite rod antennas. Such slits need not seriously affect the performance of the metal layer as a moisture vapour barrier since its performance is simply a function of the surface area of the sleeve that it covers, and it does not rely on continuity of coverage.

The sensor, or any antenna used, is preferably positioned either on the side of the cable splice nearest the likely position of the receiving apparatus (generally above the splice case) or it extends around the splice case, or several sensors or antennae may be provided.

FIG. 3b illustrates a novel arrangement where an inductor extends around a splice case. A liner 13 is of the wrap-around type, in that it may be supplied flat or slightly coiled and then wrapped around the cable splice bundle. An optional feature is the crowned ends to the liner which can be bent inwards to provide a taper from splice case diameter to diameter of the cables. Instead of the crowned ends, other forms of support could be used. Where the configuration of the liner is not predictable, it may be desirable to provide for tuning of the inductor since its inductance may vary as the liner is wrapped around the splice. Instead of a single inductor, three (or more) inductors may be arranged in mutually perpendicular configurations.

The liner 13 carries an inductor, which is shown electrically connected to a capacitor to provide a sensor comprising a passive tuned circuit. The liner and inductor illustrated could, however, be used with other types of sensors. The inductor may be attached to the liner in any suitable way, either at its surface or as an internal part of a laminate.

When the liner 13 is installed the inductor will function such that the angular positioning of the splice case does not affect the reception of an emitted signal. Thus, less craft-sensitivity is involved in installing the product.

The liner may perform functions such as mechanical protection of the splice bundle, provision of heat and moisture barriers, or it may simply act as a carrier for the inductor. In this last instance, other liners may of course be provided for mechanical protection etc.

The arrangement of inductor illustrated, and other conductor layouts (such as two mutually perpendicular inductors) which serve to render an emitted signal isotropic over substantially 90 or more and preferably as regards a plane transverse to the splice case, may be used in conjuction with other designs of liner. Other designs of liner include tubular (rather than wrap-around) designs and designs comprising semi-cylindrical half-shells.

Whatever the physical arrangements of splice case and sensor, various types of sensor may be used, for example ones with an analogue, ie continuously variable, performance or a digital, particularly step-wise, performance particulary those having two values thereby indicating whether a condition is acceptable or not acceptable. Resonant circuits can be designed for either type of performance, and in either case a transducer may be provided to cause capacitive modulation, inductive modulation or both.

Some examples of preferred transducers are as follows:

FIG. 4 shows a detection apparatus 6 coupled with a sensor 4 comprising a capacitor 15 and an inductor 16 whose inductance (and therefore the resonant frequency of the sensor) is responsive to condition C. This responsiveness results from the use of a core 17 within the inductor whose permeance is a function of condition C. An example is a core 17 of a material whose curie point is a function of temperature. Inductance could also be varied by switching in or out further turns of the inductor coil by means of a device whose conductivity is a function of the condition C.

In FIG. 5 it is the capacitance of a resonant circuit that is dependent on condition C. Where the condition to be measured is temperature a material such as a titanium oxide could be used as the dielectric of the capacitor. Moisture sensing could be carried out using a hygroscopic dielectric, although a capacitor or inductor that responds mechanically to moisture may be preferably due to smaller losses. A further capacitance could therefore be switched in or out by means of a device whose conductivity was a function of the condition C. A simple switch of this type is shown in FIG. 6 where the switch 18 may comprise for example a hygroscopic material whose resistivity is a function of water content.

A further example is the use of a device having a non-zero temperature coefficient of resistance as the switch 18 for the measurement of temperature. We prefer that such a material has a positive temperature coefficient of resistance (PTC) and comprises a conductive polymer composition optionally in conjunction with a constant wattage resistance. Alternatively, a pressure threshold could be measured by using a pressure threshold transducer as switch 18. In those cases the additional capacitor 19 will be removed from the circuit when the temperature or pressure represented by condition C has exceeded a switching temperature of the PTC device or pressure threshold transducer 18. Preferred PTC devices are those marketed under the Raychem trade mark Polyswitch.

The additional capacitor 19 in the more complex arrangement of FIG. 7 is switched in and out of the basic resonant circuit by means of a wheatstone bridge. The bridge incorporates a switch 18 responsive to condition C and an adjustable resistor 20 which sets the value of condition C that will cause the circuit to trip.

In contrast to the passive circuits illustrated above, the circuit of FIG. 8 is an active circuit, but one which is normally quiescent. The circuit will not oscillate spontaneously because the base of the transistor is not positively biased and as a result the collector current is very small and the amplification available for feedback is insufficient to maintain oscillation.

An antenna 17 such as a ferrite rod carries a tank coil 21 and a feedback coil 22. The coil 21 and the capacitor 15 constitute the tuned circuit analogous to those described above and with which the receiving/transmitting apparatus couples. The receiving/transmitting apparatus causes a small radio frequency oscillation to be induced in the circuit 15,21. If the transmitted frequency matches the resonance frequency of that circuit the amplitude of oscillation in it may become sufficient to cause a base current to flow in the transistor and for oscillations to become self-sustaining after the transmitter is turned off.

The oscillator will now act as a transmitter, and signals from it can be measured. The frequency, amplitude and duration of such signals can be used to give information regarding the condition to be investigated.

The oscillations thus produced in the circuit of FIG. 8 may be modulated by using the voltage produced at point A to switch in other circuits whose effect is to alter the resonant frequency of circuit 15,21. The switch used to do this may comprise transistors, relays, or other solid state devices.

For example, the circuit switched in may include another oscillator whose frequency is a function of the condition to be investigated. A second example is a timing circuit which deactivates the oscillator 15,21 after a period which is dependent upon the condition. A further example is an amplifier circuit for signals or pulses from microphones, particle counters or ionization detectors.

The timing circuit drawn as FIG. 9 could be connected to that of FIG. 8 at the points A,B and C to control the duration of oscillation according to a condition to which variable resistor 24 responds, for example relative humidity.

When the relative humidity, or other condition, sufficiently lowers the resistance of resistor 24 the timing circuit of FIG. 9 will discharge and restore the oscillator 15,21 more quickly to its quiescent condition by damping out the oscillation in oscillator 21.

In addition to, or instead of, the duration of oscillation being a function of, say, relative humidity, the frequency or amplitude of oscillation could be made dependent upon, say, pressure or temperature by including a capacitor or inductor whose value varies with pressure or temperature.

The circuit of FIG. 8 therefore draws virtually no current from its battery until switched on by the transmitting/receiving apparatus. The apparatus then may receive a signal of a frequency which is dependent on pressure (or temperature) and of a duration which was dependent upon relative humidity. The oscillation would then cease and the circuit draw no further current until the next interrogation.

The technique could be adapted for measurement of conditions at several locations, for example at several splice cases in a telecommunications line, in the following way. An oscillator associated with each splice case could be tuned to a different mean frequency, and sequentially activated from a single control position along the line. The total number of splice cases that could be investigated from one position would depend on the necessary frequency separation of the carriers, and on attenuation along the line.

FIG. 10 shows in a schematic way a modular system whereby a radio frequency signal is modulated by a series of audio frequency oscillators, the extent of each modulation depending on a different condition to be monitored. Preferred circuitry is shown in FIG. 11. For example, a low power transmitter at ground surface can produce a radio frequency field in an underground splice case which can trigger an oscillator therein into a state of sustained oscillation. The oscillator in the splice case is modulated by an audio oscillator circuit according to pressure, temperature, humidity or information transmitted by internal conductors etc, depending on the type of transducer in the audio oscillator circuit. The modulated radio frequency signal may be detected at the ground surface using a simple radio receiver. After a short while the oscillator in the splice case may automatically become quiescent again.

In FIGS. 10 and 11 the receiver R uses for example a ferrite rod antenna tuned to the frequency of a suitable triggering signal. A triggering signal induces a voltage in the receiver R, and when this voltage reaches a certain value (say about 0.3 V) it brings a zero-biased transistor into conduction. The collector current from this transistor produces a large change of voltage across the collector load (said about 1 mega ohm) which is then applied via the passive timer network T1 to an audio frequency oscillator (AF1) to switch it into oscillation.

AF1 may be an audio square wave oscillator using a pair of CMOS NAND gates. Its frequency of oscillation will depend on the values of the capacitor C1 and resistor R1, and therefore upon a condition to be measured if suitable transducers (represented as sensor S1) are used to control C1 and/or R1. The amplitude of the square wave output of AF1 will in general be close to the rail to rail voltage of the power supply, for example 3.2 V in the case of a lithium cell.

The device transmits through RF1, which is a radio frequency oscillator using a single NAND gate and a resonant circuit consisting of a coil on a ferrite rod (optionally the same rod as used in receiver R) which acts as a transmitting antenna, optionally transmitting at the same frequency as the incoming triggering frequency. RF1 is turned on an off by the audio frequency signal from AF1 which is applied to the spare NAND output.

While AF1 is oscillating, a rectified output therefrom may be applied as a bias to a filter/timer network T2. Then when AF1 stops oscillating, the resulting change in bias switches on AF2 which will oscillate for a time determined by the resistive and capacitive values of T2. AF2 now modulates the incoming RF1 frequency to an extent depending on a second condition, i.e the state of its sensor S2. When AF2 ceases to oscillate, AF3 is switched on in a similar manner, and that then modulates RF1. Thus, the transmitter is modulated sequentially by audio frequencies determined by the state of each of the sensors S1, S2, S3 etc.

The device illustrates in FIGS. 10 and 11 is economical in the components it requires, it can use widely available integrated circuits, and the current it consumes may be very small such as 0.5 ma. It may easily be adapted to suit the amount of information required since additional sensors can easily be added. The precise circuitry shown may of course be modified whilst retaining the concepts of a modular system which automatically transmits information in sequence from a variety of sensors.

FIG. 12 shows a capacitor 24 whose capacitance varies with relative humidity or mere presence of water. The control for the capacitor comprises a moisture absorbing material 25, preferably in strip form, on a resilient metal member 26. When the humidity increases the material 25 expands causing the strip to bend downwards as drawn. (The material 25 could be placed underneath the member 26, thus causing the member to bend in the opposite fashion.) The capacitor itself comprises a fixed metal plate 30, an insulating film 29 and a moveable metal plate 27, all mounted on an insulating board 31. The position of the metal plate 27 will determine the capacitance of the combination of plate 30, film 29 and plate 27. Plate 27 is caused to move by the movement of member 26 acting through a set-screw 28 which is used for zero-setting. The member 26 itself could of course form the moveable plate of the capacitor, thus eliminating the means for callibration. Capacitance could be made dependent on temperature by employing, for example, a bimetallic strip.

The device shown in FIG. 13 translates changes in ambient pressure into mechanical movement in a similar way to an aneroid barometer. The interior of the device remains at a substantially fixed pressure, for example atmospheric pressure or a vacuum or partial vacuum, and changes in external pressure will cause a bending or unbending motion as indicated by the arrows. The device could be used to vary the capacitance of a capacitor, the inductance of an inductor, or operate a switch which brought a further capacitor or inductor into or out of a resonant circuit. In particular the device may replace the moisture absorbing material 25 of FIG. 12 thereby converting the capacitor of that Figure into one that is pressure rather than moisture sensitive.

FIGS. 14 and 15 illustrate techniques whereby the size of the resonant circuit may be reduced, problems of screening by foil moisture vapour barriers may be avoided, and unpredictable signal modification by cable conductors may be overcome. The solution is to use the transmitter/receiver apparatus 6 to induce currents in the cable screen 32 and to couple these currents to the resonant circuit. Alternatively, coupling could take place with the foil barrier or with certain conductors of the cable.

The splice case 1 surrounds cables 2 which carry a screen 32 or other available conductor. The apparatus 6 produces an alternating magnetic field which induces an alternatively e.m.f. along the screen 32. The screen continuity wire 34 includes an inductor 36 coupled by means of a core 17 to the inductor 16 of the resonant circuit. It is now possible for the resonant circuit to be screened such that it will not be influenced by any metal in the cable or splice case. Also, inductor designs having a low loss may be used thus making the resonance of the circuit sharper.

The core 17 is preferably a low loss ferrite, particularly in the form of a toroid, having an air gap. A conductive or magnetically permeable body is then arranged to move into the air gap in response to the condition to be measured. The transducer which causes such movement may be any described herein. The low flux leakage of such a core makes it insensitive to disturbance by external objects even if they be conductive or magnetic.

The apparatus 6 preferably transmits in a pulsed form, allowing it to detect during quiet intervals the presence of alternating currents over a narrow frequency range in the cable screen. Such currents are produced by ringing of the resonant circuit 15,16. The modulated resonant frequency may be determined by the apparatus 6 sweeping over its frequency range to find the frequency of maximum response. Alternatively, the apparatus 6 could measure the average period of a set number (such as 10-20) cycles of the received ringing pulse.

In FIG. 14 the cable screen is assumed to be earthed at its ends 33 remote from the splice case but in any case it is likely that the capacitance between a cable screen and earth would give a low impedance to earth. The apparatus 6 could be placed at any point along the cable length since the screen current induced would persist for long distances along the cable (for example 30 m) and therefore flow through the coupling loop and excite the resonant circuit 15,16. Although information regarding different splice cases could be differentiated by separation of resonant frequencies, the circuit illustrated could not easily be used for precise location of a splice case along a cable. The cable itself can of course be located.

The arrangement of FIG. 15, however, allows for splice case location by positioning the resonant circuit 15,16 between the screen continuity wire 34 and a local earth 35. This produces a signal which drops to zero when the apparatus 6 is directly over the splice case. The coupling loop on the ferrite core 17 through which some of the screen current passes may need to be of several turns for optimum matching.

The localized earth 35 may be provided by a conductive material, for example as a layer on an external surface of the splice case. One way of achieving this is to manufacture the splice case sleeve from, or to coat the sleeve with, a conductive polymer composition. An internal liner could provide general insulation around the splice bundle.

FIG. 16 shows a preferred core 16 plus windings 38, 39 for coupling a cable screen in a variable way to a resonant circuit. The resonant circuit preferably consists of 100 turns of enamelled copper wire 39 and, for example, a 4700 pF polystyrene dielectric capacitor, tuned to say 148 KHz. The primary winding connected to the cable screen comprises preferably about 2 windings of soft 0.7 mm copper wire. The core is preferably a 9 mm outside diameter soft ferrite toroid with a 1 mm wide gap 37. A plate 40 comprising a ferrite loaded epoxy resin is arranged to move into and out of the gap 37 in response to a condition to be measured. Where that condition is relative humidity, the plate 40 may be held by a brass strip 41 about 0.1 mm thick and coated with a film of secondary cellulose acetate whose length will vary with water content causing the brass strip to bend. A screw 28 is provided for adjustment.

The circuits of FIGS. 17 and 18 provide a step-wise change in an output signal in response to moisture content (or some other condition) changing to a predetermined extent. The advantage of a stepwise change is that the investigator does not have to scan over a band of, say, frequencies, but rather has to check simply which of preferably two frequencies is active. This can give sufficient information because all that one generally needs to know is whether the condition is acceptable or not. The circuits illustrated, or other circuits of comparable function, are preferable to mechanical switches which risk long-term contamination of their contacts.

It is desirable that the electrical switch when switched on has a low enough resistance that the Q value of the resonant circuit remain high, i.e the resonance be sharp.

A suitable circuit comprises a coil wound on a ferrite rod antenna, tuned to about 150 KHz by a combination of fixed and trimming capacitors 15,18. The total capacitance may be about 120 pF, 20 pF of which can be switched in or out of the circuit giving a frequency shift of 10%, i.e 15 KHz.

Switching in FIGS. 17 and 18 is performed by a field effect transistor (FET) 42. A FET having an on resistance less than 1000 ohms would not reduce the Q value of a tuned circuit from an initial value of 200 to below about 150. Such a reduction is acceptable for most purposes contemplated here.

In FIG. 17 the FET is switched on when a moisture-activated battery 43 produces an emf of say 3 V. The battery may be constructed in any of a variety of ways corresponding to various types of primary cell, and each cell may consist of an anode, a cathode and a porous material joining them containing a dry salt which forms an electrolyte in the presence of water. For example a type of miniature leclanche cell may be made from a strip or wire of zinc, and a wire coated with a composition containing carbon and manganese dioxide which are separated by a porous medium (for example paper, plaster of paris or silica gel) which is impregnated with ammonium chloride. Below about 80% relative humidity this composition will remain dry, and the cell will have a very high internal resistance. As a result, if a high resistance, for example 10$^7$ or 10$^8$ ohms, were placed across the cell, a very low emf would result. At greater than about 80% relative humidity, ammonium chloride becomes deliquescent and water absorption will result in the cell resistance dropping such that an emf of about 1.5 V will be generated. Two such cells in series would produce a high enough emf to switch the FET on or off.

The current drawn at the FET gate would be negligible, and current drain through the resistance could be made small enough to avoid drain on the battery before the moisture-induced switching had occured.

FIG. 18 shows a variation of the system of FIG. 15, where a long life permanently active cell (such as a Li-I2 cell) is used in series with a fault-responsive switch 24. Such a switch may comprise a moisture-dependent resistor such as a deliquescent salt in a porous material. The electrodes used in the porous material are preferably non polarizing or reversible (for example Ag/Ag Cl) of sufficient capacity to accommodate a low current drain through the resistor for the period between initial increase in humidity and monitoring.

FIGS. 19a and 19b (the latter being a section along B—B of the former) illustrate a preferred splice case 44 with which the sensor may be used. The splice case is of the butt design, by which we mean that the cables to be spliced enter and leave the case through one end thereof. The case 44 comprises a base 45 and a cover 46. The base 45 and cover 46 may be attached together in any suitable way, and preferably such that the case can be re-entered. For example some sealing means, such as an O-ring, may be provided between the base and the cover, the two parts being held together by a clamp that engages flanges on each part.

The base 45 carries outlets 46 which provide a seal to the ingoing cables. The seal preferably results at least in part from dimensional-recovery, particularly heat-shrinkage of the outlets, and a sealing material such as a hot-melt adhesive may also be provided. In the design illustrated the base carries four outlets 47, two of which are in use and two of which are available for future use. The outlets are preferably supplied blind in order that the splice case be sealed even if not all outlets are in use. Preferably an outlet can be opened simply by cutting away its closed end.

Where heat is required at the outlets, either for causing dimensional-recovery or activation of a sealing material or both, it is preferably provided electrically. Thus, the outlets preferably comprise heat-shrinkable sleeves having electric self-heating, preferably self-regulating with respect to temperature. The outlets may be integral with the base, but are preferably discrete and attached for example by shrinkage over and/or bonding or welding to protrusions on the base.

The cover 46 preferably has a recess or other means 48 which affixes or houses the sensor or a component thereof such as a inductor. A transducer will be located for communication with the splice case but is omitted for clarity. Means may be provided for affixing or housing a transducer and/or for connection thereof to other components of a sensor.

The cover is conveniently manufactured by blow moulding, but other techniques will be suitable.

A splice case of the type illustrated is particularly useful for enclosing radial distribution points where a number of drop wires leave a telecommunications distribution cable. The cable would then enter and leave the case through one or two large outlets, and drop wires connected to a bared portion of the looped cable within the case would be sealed by further outlets in the base.

In this and other types of splice case a branch-off clip may be used to seal two or more cables at a point where they leave an end of a recoverable sleeve. See UK Patent specification 2019120.

The design illustrated in FIG. 19 is also a preferred design of case for enclosing a splice in an optical fibre cable. In that instance the cover 46 may house a splice organizer which may comprise for example a series of plates on each of which one or more fibre splices would be stored together with several turns of fibre either side of the splice. The plates may be conveniently hinged together so a chosen plate can be exposed. We prefer that each plate be hinged along a short edge thereof, and be hinged at least indirectly to the base of the splice case.

Provision of a sensor of the type discussed in an optical fibre splice case is particularly useful not only for investigation of the condition of the case (since there may be no copper pairs which could be used to transmit information of this type easily) but also for location of the splice case. This is because the possible total absence of metal makes traditional methods impossible.

Figure 20B:
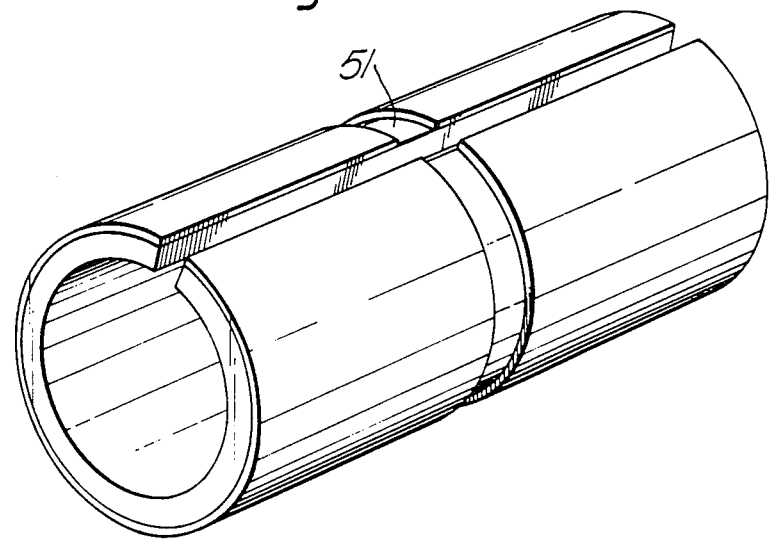
Figure 21A:
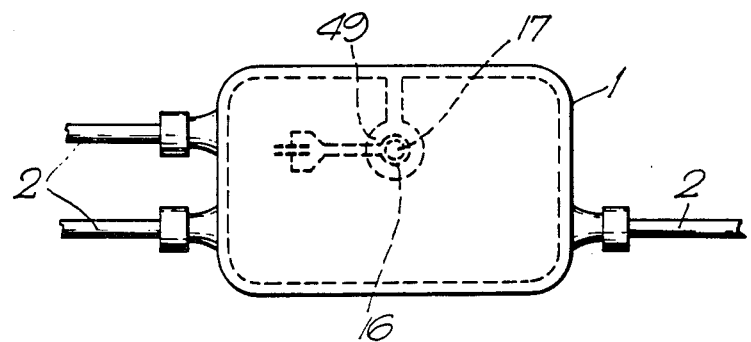
Figure 21B:
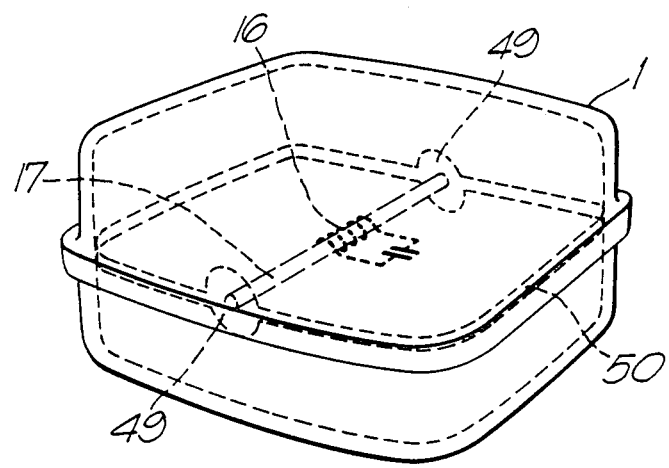
Figure 22A:
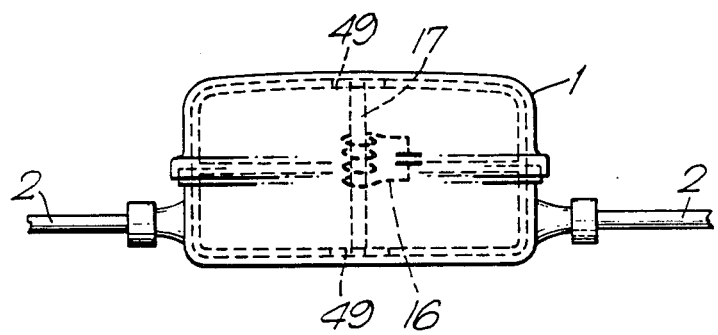
Figure 22B:
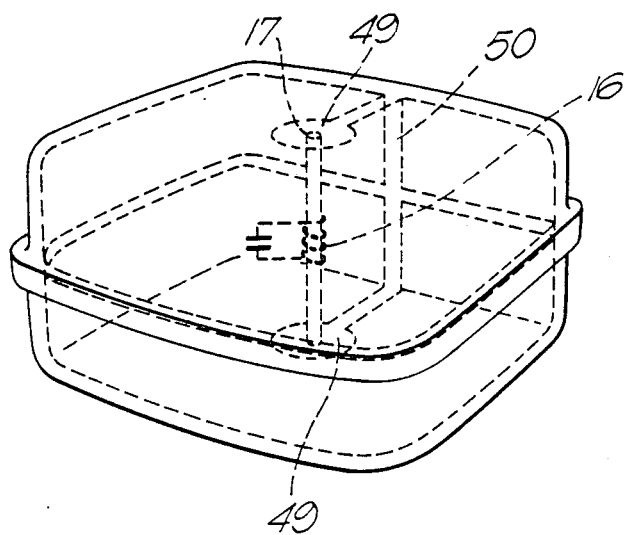

FIGS. 20-22 illustrate various liners and splice cases 1 which contain metal layers modified to allow electromagnetic detection of an internal sensor. The metal may be provided as a moisture vapour barrier or for mechanical strength etc., and it may be the only component of the article illustrated or it may comprise just one layer for example of a multi-layer laminate. FIG. 20 illustrates a liner or a sleeve for forming a splice case, and means may be provided at the ends of the article illustrated for forming a seal to the ingoing cables. Such means may for example comprise integral or discrete crowned portions (as illustrated in FIG. 3b) or may comprise dimensional recoverability. FIGS. 21 and 22 illustrate splice cases of a generally rectangular shape, but what is said below applies also to other designs of splice case.

Where the body (such as a splice case 1) within which the sensor is housed comprises a metal, receipt of information from the sensor may be difficult or impossible due to the metal acting as a screen and blocking or depend on the particular use but the skilled man will be able to determine what shapes to employ to ensure that the magnetic field from the apparatus lies approximately along the axis of the core 17.

Removal of small areas of metal foil will in general not significantly reduce the performance of the metal-foil as a moisture vapour barrier. Where, however, larger areas are desirably removed or where very low moisture transmission is desired, or where the metal has some other function such as mechanical strength some other material may replace the removed metal. For example, a mica or other water impermeable material may be bonded to the remainder of the splice case or liner.

We claim:

1. An article comprising an enclosure and a sensor in communication therewith, the sensor being responsive to a condition within the enclosure, the sensor response being capable of being detected remotely so that the location and the condition of the enclosure can be determined without access to the enclosure, wherein the sensor comprises:
   (a) a tuned electrical circuit capable of exhibiting a first resonant frequency;
   (b) means for modifying the electrical circuit in response to a change in the condition so that it exhibits a second resonant frequency; and
   (c) a transducer which includes a field effect transistor for performing the switching of the modifying means into or out of the circuit in response to a change in the condition within the enclosure.

2. An article as claimed in claim 1, in which the transducer comprises a device capable of translating changes in pressure into mechanical movement, so that switching of the transducer is dependent on the pressure within the enclosure.

3. An article comprising a splice case and a sensor in communication therewith, the sensor being responsive to a condition within the splice case, the sensor response being capable of being detected remotely so that the location and the condition of the splice case can be detected without access to the splice case, wherein the sensor comprises:
   (a) a tuned electrical circuit being capable of exhibiting a first resonant frequency;
   (b) means for modifying the circuit in response to a change in the resonant condition so that it exhibits a second resonant frequency; and
   (c) a transducer for switching the modifying means into or out of the circuit in response to a change in the condition within the splice case, wherein the splice case encloses a splice between two cables.

4. An article comprising a splice case and a sensor in communication therewith, the sensor being responsive to a condition within the splice case, the sensor response being capable of being detected remotely so that the location and condition of the splice case can be determined without access to the splice case, wherein the sensor comprises:
   (a) a tuned electrical circuit capable of exhibiting a first resonant frequency;
   (b) means for modifying the circuit in response to a change in the condition so that it exhibits a second resonant frequency; and
   (c) a transducer, which includes a field effect transistor, for performing the switching of the modifying means into or out of the circuit in response to a change in the condition within the splice case.

5. An article as claimed in claim 4, in which the splice case encloses a splice between at least two cables.

6. An article comprising a splice case for enclosing a splice between two cables, and a sensor in communication the splice case, the sensor being responsive to a condition within the splice case, the sensor response being capable of being detected remotely such that the location and condition of the splice case can be determined without requiring access to the splice case, wherein the sensor comprises an electrical circuit capable of responding to electromagnetic radiation, and means capable of causing an output signal of the circuit to be modified in response to a change in the condition, and wherein the splice case includes a metal moisture vapor barrier provided with means to allow passage of electromagnetic radiation therethrough.

7. An article according to claim 6, in which the moisture vapor barrier has apertures formed therein to allow passage of electromagnetic radiation through the barrier.

8. An article according to claim 6, in which the circuit has a resonant frequency that is a function of said condition.

9. An article according to claim 6, in which the duration of the output signal is a function of said condition.

10. An article according to claims 6, in which the circuit is a tuned circuit comprising one or more capacitors and one or more inductors.

11. An article according to claim 10, including a capacitive transducer the presence of which causes the capacitance of the tuned circuit to depend on said condition.

12. An article according to claim 10, including an inductive transducer the presence of which causes the inductance of the tuned circuit to depend on said condition.

13. An article according to claim 11, in which the capacitive transducer causes a change in capacitance according to environmental conditions such as temperature, pressure, relative humidity or presence of water.

14. An article according to claim 12, in which the inductive transducer causes a change in inductance according to environmental conditions such as temperature, pressure, relative humidity or presence of water.

15. An article according to claim 11, in which the capactive transducer alters the capactitance of a capacitor of the circuit.

16. An article according to claim 11, in which the capactive transducer switches a capacitor into or out of the circuit.

17. An article according to claim 16, in which the switching is carried out by means which comprises a field effect transistor.

18. An article according to claims 6, in which the circuit is passive.

19. An article according to claims 6, in which the circuit comprises an activatable oscillator.

20. An article according to claim 19, in which the oscillator is in a quiescent state and can be activated by electromagnetic radiation.

21. An article according to claim 19, in which the oscillator is in a quiescent state and can be activated by a change in said condition.

22. An article according to claim 21, in which the oscillator is powerable by a cell which becomes active on increasing its ambient relative humidity.

23. An article according to claim 6, in which the splice case has at least one dimensionally-recoverable outlet for a cable.

24. An article according to claim 23, in which the splice case comprises a heat-shrinkable sleeve.

25. An article according to claim 24, in which the splice case has means for affixing or housing within it the sensor or a component thereof.

26. An article according to claim 12 in which the inductive transducer alters the inductance of an inductor of the circuit.

27. An article according to claim 12 in which the inductive transducer switches an inductor into or out of the circuit.

28. An article according to claim 27 in which the switching is carried out by means which comprises a field effect transistor.

29. A method of investigating remotely a condition within a splice case, which comprises:
 (a) providing a sensor in communication with the splice case for sensing a condition within the splice case, the sensor response being capable of being detected remotely such that the location and condition of the splice case can be determined without requiring access to the splice case, wherein the sensor comprises:
  (i) a tuned electrical circuit capable of exhibiting a first resonant frequency,
  (ii) means for modifying the circuit in response to a change in the condition so that it exhibits a second resonant frequency, and
  (iii) a transducer for switching the modifying means into or out of the circuit;
 (b) exposing the sensor to electromagnetic radiation from a remote source, the radiation being applied sequentially with a frequency corresponding to the said first and second resonant frequencies respectively; and
 (c) monitoring for emission of radiation by the sensor in response to the exposure thereof to radiation of a frequency corresponding either to the first resonant frequency or to the second resonant frequency.

* * * * *

UNITED STATES PATENT AND TRADEMARK OFFICE
CERTIFICATE OF CORRECTION

PATENT NO. : 4,862,088                    Page 1 of 2

DATED : Nolf et al.

INVENTOR(S) : August 29, 1989

It is certified that error appears in the above-indentified patent and that said Letters Patent is hereby corrected as shown below:

Cover Page [19], line 2, replace "Etienne et al." by --Nolf et al.--

Cover Page, Inventors [75], lines 1 to 2, replace "Nolf J. Etienne" and "Atkinson E. Browell" by -- Jean-Marie E. Nolf-- and --Edward B. Atkinson--, respectively.

Cover Page, References Cited [56], U.S. Patent Documents, line 5, before "4,549,039" as a separate line, insert --4,529,961 7/1985  Nishimura et al.   340   807.33--

Column 1, line 48, replace "presense" by --presence--.

Column 1, line 59, replace the second occurrence of "of" by --or--.

Column 2, line 14, replace "truely" by --truly--.

Column 3, line 52, replace "In," by --In--.

UNITED STATES PATENT AND TRADEMARK OFFICE
CERTIFICATE OF CORRECTION

PATENT NO. : 4,862,088

DATED : Nolf et al.

INVENTOR(S) : August 29, 1989

It is certified that error appears in the above-indentified patent and that said Letters Patent is hereby corrected as shown below:

```
Column 4, line 23, replace "means" by --mean--.
Column 4, line 55, after "could" insert --be--.
Column 6, line 50, replace "drawings" by --drawing--.
Column 8, line 35, replace "ie" by --i.e.--.
Column 11, line 15, replace "illustrates" by --illustrated--.
Column 14, line 20, replace "46" by --47--.
Column 16, claim 10, line 1, replace "claims 6" by --claim 6--.
Column 17, claim 18, line 1, replace "claims 6" by --claim 6--.
Column 17, claim 19, line 1, replace "claims 6" by --claim 6--.
```

Signed and Sealed this

Fourth Day of April, 1995

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 4,862,088
DATED : Nolf et al.
INVENTOR(S) : August 29, 1989

It is certified that error appears in the above-indentified patent and that said Letters Patent is hereby corrected as shown below:

Cover Page [73] Assignee, replace "Raychem Corporation" with --NV Raychem SA, Kessel-Lo, Belgium--.

Signed and Sealed this

Second Day of May, 1995

Attest:

BRUCE LEHMAN

*Attesting Officer*     *Commissioner of Patents and Trademarks*